United States Patent
Pidutti et al.

(10) Patent No.: US 12,222,377 B2
(45) Date of Patent: Feb. 11, 2025

(54) INTELLIGENT SEMICONDUCTOR SWITCH WITH INTEGRATED CURRENT MEASUREMENT FUNCTION

(71) Applicant: Infineon Technologies AG, Neubiberg (DE)

(72) Inventors: Albino Pidutti, Villach (AT); Andrea Baschirotto, Tortona (IT); Paolo Del Croce, Villach (AT)

(73) Assignee: Infineon Technologies AG, Neubiberg (DE)

( * ) Notice: Subject to any disclaimer, the term of this patent is extended or adjusted under 35 U.S.C. 154(b) by 133 days.

(21) Appl. No.: 18/296,878

(22) Filed: Apr. 6, 2023

(65) Prior Publication Data
US 2023/0375599 A1    Nov. 23, 2023

(30) Foreign Application Priority Data
May 20, 2022   (DE) .......................... 102022112757.5

(51) Int. Cl.
*G01R 19/10* (2006.01)
*H03K 17/56* (2006.01)

(52) U.S. Cl.
CPC ............. *G01R 19/10* (2013.01); *H03K 17/56* (2013.01)

(58) Field of Classification Search
CPC .... G01R 19/10; G01R 19/0092; H03K 17/56; H03K 2217/0027; H03K 17/122; H02M 1/0006; H02M 1/0009; H02M 1/08; H02M 1/088; H02M 1/0003; H02M 1/0041
USPC .................................. 324/140, 76.11, 76.52
See application file for complete search history.

(56) References Cited

U.S. PATENT DOCUMENTS

| | | | |
|---|---|---|---|
| 11,867,762 B1* | 1/2024 | Nuebling | H03K 17/0822 |
| 2020/0153338 A1* | 5/2020 | Ribarich | H02M 1/08 |
| 2024/0039384 A1* | 2/2024 | Lv | H02M 1/0009 |

FOREIGN PATENT DOCUMENTS

| | | |
|---|---|---|
| DE | 102020100601 A1 | 7/2020 |
| DE | 102020105094 A1 | 9/2021 |

OTHER PUBLICATIONS

Office Action from counterpart German Application No. 102022112757.5 dated Jan. 5, 2023, 5 pp.

* cited by examiner

*Primary Examiner* — Giovanni Astacio-Oquendo
(74) *Attorney, Agent, or Firm* — Shumaker & Sieffert, P.A.

(57) ABSTRACT

A method for current measurement in a switching converter is described herein. In accordance with one embodiment, the method includes switching a first transistor on and off in accordance with a logic signal, wherein a load current passes through the first transistor while it is switched on. The method further includes providing—by a second transistor—a sense current that is indicative of the load current, wherein the second transistor is coupled to the first transistor so that the first and the second transistors are switched on and off simultaneously. Further, the method includes determining an end of a switch-on phase of the second transistor, and providing a current sense signal that represents the sense current between a first time instant, which corresponds to the determined end of the switch-on phase, and a second time instant, at which the logic signal signals a switch-off of the first transistor.

12 Claims, 3 Drawing Sheets

INTELLIGENT SEMICONDUCTOR SWITCH WITH INTEGRATED CURRENT MEASUREMENT FUNCTION

This Application claims priority to German Application Number 102022112757.5, filed on May 20, 2022, the entire content of which is incorporated herein by reference.

TECHNICAL FIELD

The present disclosure relates to the field of intelligent semiconductor switches, in particular to an integrated semiconductor circuit including a transistor as switching device and a current measurement circuit. The present disclosure further relates to the field of switching converters for voltage conversion in which one or more intelligent semiconductor switches can be used.

BACKGROUND

Intelligent semiconductor switches are increasingly replacing "normal" power transistors in various applications. Switching converters, such as buck converters which may be used to supply various electric loads, are one such example. In illumination applications, for example, light emitting diodes (LEDs) can be supplied using a buck converter.

Current sensing is an important capability for controlling the function of the circuit in switching converters. In switching converters, current sense resistors are commonly used to obtain information about the inductor current which passes through the switching converter's inductor. The information concerning the inductor current is used to implement a so-called load current control.

A current sense resistor, which needs to be coupled to the inductor, is a separate circuit component and requires a dedicated input pin at the integrated control circuit of the switching converter. In order to increase the level of integration, the external current sense resistor and the power transistor, as well as some of the control circuitry, may be integrated in one semiconductor device. However, an integrated current sense circuit is only capable of delivering current information while the power transistor is active (switched on). When the power transistor is inactive (switched off), the inductor current cannot be measured.

SUMMARY

A method for current measurement in a switching converter is described herein. In accordance with one embodiment, the method includes switching a first transistor on and off in accordance with a logic signal, wherein a load current passes through the first transistor while it is switched on. The method further includes providing—by means of a second transistor—a sense current that is indicative of the load current, wherein the second transistor is coupled to the first transistor such that the first and the second transistors are switched on and off simultaneously. Furthermore, the method includes determining an end of a switch-on phase of the second transistor, and providing a current sense signal that represents the sense current between a first time instant, which corresponds to the determined end of the switch-on phase, and a second time instant, at which the logic signal signals a switch-off of the first transistor (TL).

Further, a circuit for use in a switching converter controller is described herein. In accordance with one embodiment, the circuit includes a first transistor configured to provide a load current in accordance with a logic signal, a sense transistor coupled to the first transistor and configured to provide a sense current that is indicative of the load current, and a control circuit that is configured to: determine an end of a switch-on phase of the sense transistor and to provide a current sense signal that represents the sense current between a first time instant, which corresponds to the determined end of the switch-on phase, and a second time instant at which the logic signal signals a switch-off of the first transistor.

BRIEF DESCRIPTION OF THE DRAWINGS

The embodiments, which are described in the following, can be better understood with reference to the following drawings and descriptions. The components in the figures are not necessarily to scale; instead emphasis is placed upon illustrating the principles of the embodiments described herein. Furthermore, in the figures, like reference numerals designate corresponding parts.

FIG. 2 illustrates the charging phase of the transistor's gate capacitance when the transistor is switched on.

DETAILED DESCRIPTION

Figure 1:
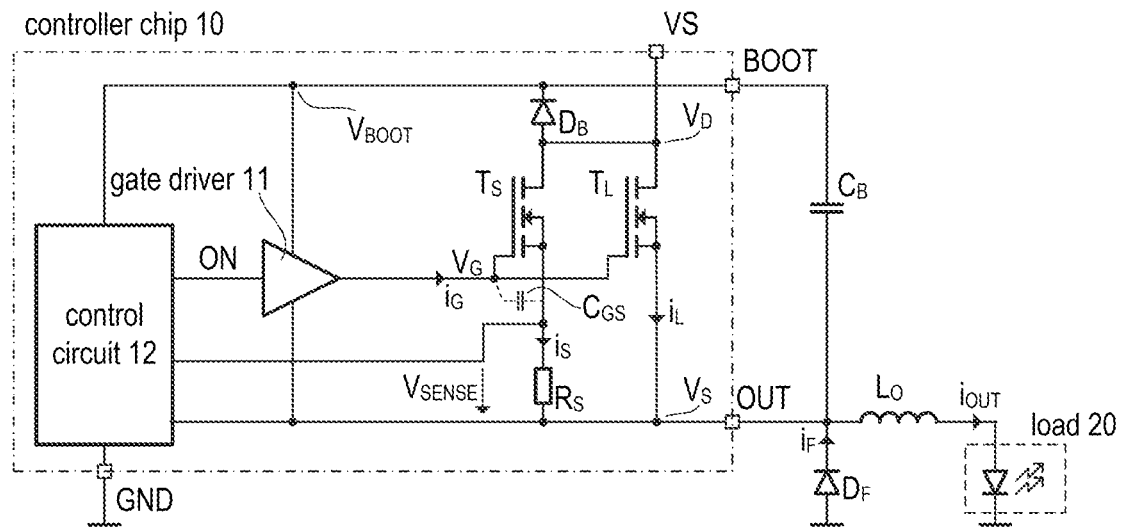
FIG. 1 illustrates one example of a buck converter with a power transistor, current measurement and control circuitry integrated in one semiconductor chip.

FIG. 1 illustrates one example of a buck converter with a power transistor, current measurement and control circuitry integrated in one semiconductor chip, referred to as controller chip 10. As can be seen in FIG. 1, the only discrete circuit components are the inductor $L_O$, a free-wheeling element (diode $D_F$), a capacitor $C_B$ and, naturally, the electric load 20, which is a LED in the present example.

The controller chip 10 includes a power transistor $T_L$ having a load current path (drain-source current path) that is coupled between a supply pin VS and an output pin OUT of the controller chip 10. During operation, a supply voltage $V_S$ is applied at the supply pin VS. The inductor $L_O$ is connected between one terminal of the load 20 (e.g. anode of the LED) and the output pin OUT. The other terminal of the load 20 (e.g. cathode of the LED) may be connected to ground potential. The diode $D_F$ is connected between the output pin OUT and the ground potential. In some applications, the diode $D_F$ is replaced by a second power transistor. In some embodiments the diode $D_F$ (or, instead, a transistor) may be integrated in the controller chip. In this context, the term "pin" refers to any common chip contact. Accordingly, "pin" may designate a solder pin or a solder ball for the surface mounting of the chip onto a circuit board. Alternatively, the pins may be configured for through-hole mounting.

The controller chip 10 further includes a so-called sense transistor $T_S$. The drain electrodes and the gate electrodes of the two transistors $T_S$ and $T_L$ are interconnected, wherein a current sense resistor $R_S$ is connected between the source electrode of the sense transistor $T_S$ and the output pin OUT. In contrast thereto, the source electrode of the power transistor $T_L$ is directly connected to the output pin OUT. In the present example, the current passing through the power transistor $T_L$ is denoted as $i_L$ (load current) while the current passing through the sense transistor $T_S$ and the resistor $R_S$ is denoted $i_S$ (sense current). While the transistors are active (switched on, time interval $T_{ON}$), the inductor current $i_{OUT}$ equals the sum of the transistor currents $i_L+i_S$. When the transistors are off, the inductor current $i_{OUT}$ passes through the free-wheeling diode $D_F$.

The two transistors $T_S$ and $T_L$ may be implemented in the same transistor cell array, wherein the number of cells $N_L$, which compose the power transistor $T_L$, is much higher than the number of cells $N_S$, which compose the sense transistor $T_S$. As the two transistors $T_S$ and $T_L$ are operated in approximately the same operating point, the ratio $i_L/i_S$ is approximately equal to the ratio $k=N_L/N_S$. Thus the load current $i_L$ may be inferred from the current sense signal $V_{SENSE}$ according to the equation $i_L=k\cdot i_S=k\cdot V_{SENSE}/R_S$. The output current $i_{OUT}$ equals $(k+1)\cdot i_S$.

The gate voltage $V_G$ applied to the gate electrodes of transistors $T_L$ and $T_S$ is generated by the gate driver circuit 11, which is configured to generate the gate voltage $V_G$ (or a gate current $i_G$ resulting in a respective gate voltage) in accordance with a logic signal ON. The logic signal ON is a control signal indicating the desired switching state (on or off) of the transistor $T_L$. In the present example, the logic signal ON is provided by a control circuit 12, which is configured to generate the logic signal ON based on the current sense signal $V_{SENSE}$ and other parameters. The control of switching converters, in particular of a buck converter, is as such known and thus not further discussed herein.

The above-mentioned equation $i_L=k\cdot V_{SENSE}/R_S$ is not exactly valid during a switch-on process of the transistors $T_L$ and $T_S$, because during the switch-on of transistor $T_S$ the displacement current passing through the gate-source capacitance $C_{GS}$ of the sense transistor $T_S$ also flows through the sense resistor $R_S$ and contributes to the voltage drop $V_{SENSE}$ across the sense resistor $R_S$, which may cause a measurement error. It is noted that this source of systematic measurement errors is a consequence of the current sense resistor $R_S$ being integrated in the controller chip 10. Using an external current sense resistor in series with the inductor $L_O$ would not cause such a systematic error. This situation is further explained with reference to FIG. 2.

Figure 2:
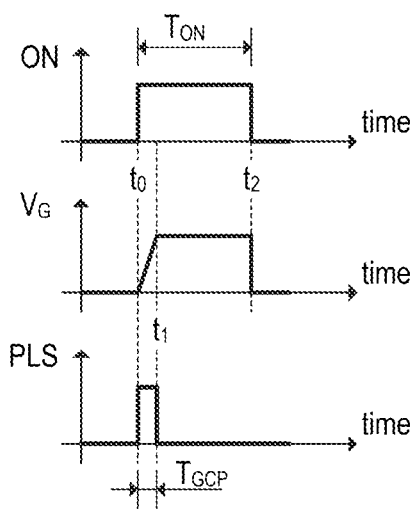

FIG. 2 includes three timing diagrams illustrating, by way of example, a switch-on process of the transistors $T_L$ and $T_S$. The top diagram of FIG. 2 illustrates an example of the logic signal ON, the middle diagram illustrates a corresponding example of the gate voltage $V_G$, and the bottom diagram illustrates a pulse, the length of which corresponds to the length of the switch-on process of the transistors $T_S$ and $T_L$. As can be seen in FIG. 2, the control circuit 12 sets the logic signal ON to a High Level at time instant $t_0$ (indicating that the transistors $T_L$ and $T_S$ are to be switched on) and back to a Low Level at time instant $t_2$ (indicating that the transistors $T_L$ and $T_S$ are to be switched off). However, the transistors $T_L$ and $T_S$ cannot instantaneously become conductive. In the depicted example, it takes from time instant $t_0$ to time instant $t_1$ to charge the gate-source capacitance. As the gate-source capacitance is being charged, the gate-voltage ramps up to a value needed to fully switch on the transistors $T_S$ and $T_L$. In the example of FIG. 2, the duration of this switch-on process is denoted as $T_{GCP}=t_1-t_0$.

Figure 3:
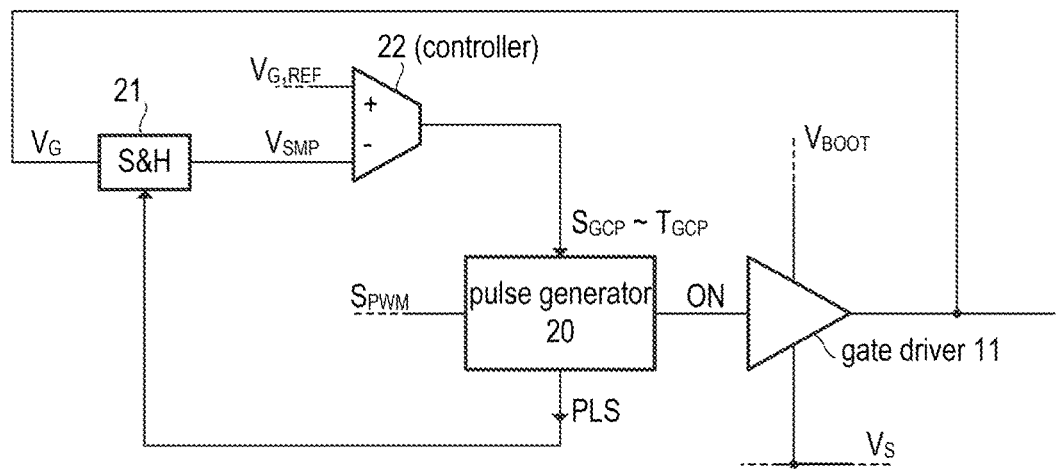
FIG. 3 illustrates an example of a circuit which may be used to determine the duration of the charging phase of the gate capacitance.

In order to obtain a precise current measurement, the time interval $T_{GCP}$ is blanked out in accordance with the concept described herein. However, the time interval $T_{GCP}$ is not constant and may vary dependent on different parameters (e.g. temperature, aging, etc.), as well as on tolerances of the manufacturing process. FIG. 3 illustrates one example of a circuit which can be used to determine the time interval $T_{GCP}$ and to adaptively adjust it during operation of the controller chip 10.

FIG. 3 illustrates the gate driver 11 and part of the control circuit 12 (see also FIG. 1). The pulse generator 20 generates the logic signal ON from the signal $S_{WPM}$ (which may be a pulse-width modulated, PWM, signal) and also outputs a signal PLS with a pulse with length $T_{GCP}$ as shown in the timing diagrams of FIG. 2. The signal ON is basically a copy of the signal $S_{PWM}$. Accordingly, the rising edges of a pulse in the logic signal ON and of a corresponding pulse in the signal PLS are practically coincident. The length $T_GCP$ of the pulse PLS depends on the input signal $S_{GCP}$ supplied to the pulse generator 20. That is, the input signal $S_{GCP}$ determines the duration $T_GCP$ of the currently generated pulse in signal PLS.

The signal PLS is supplied, as a control signal, to a control input of a sample and hold circuit 21, which receives the gate voltage $V_G$ as input signal and provides the signal $V_{SMP}$ as output signal. In the present example, the output signal $V_{SMP}$ is equal to the input signal $V_G$ as long as the control input "sees" a High Level, whereas the output signal $V_{SMP}$ remains at its current level when the control input changes to a Low Level. In other words, the sample and hold circuit 21 samples the gate voltage $V_G$ at the time instant at which a pulse signal PLS exhibits a falling edge (see FIG. 2, time instant $t_1$).

The circuit of FIG. 3 also includes a controller 22, which receives the sampled voltage $V_G$ and a reference voltage $V_{G,REF}$ (set point) and generates, as output signal, the control signal $S_{GCP}$. The controller 22 may be a difference amplifier, which operates a P-controller (P meaning "proportional"). As mentioned, the control signal $S_{GCP}$ is supplied to the pulse generator 20, wherein the level of the control signal $S_{GCP}$ determines the pulse lengths $T_{GCP}$ pf the pulses PLS.

As can be seen from FIG. 3, the depicted circuit implements a control loop which iteratively adjusts the pulse length $T_GCP$ until the sampled gate voltage $V_{SMP}$ corresponds to the reference value $V_{G,REF}$. When the circuit is powered on, an initial value of $T_GCP$ may be used that is at the lower end of its possible range, as a result of which $T_GCP$ initially tends to be too short, whereby the control loop will adjust $T_GCP$ to its correct value within one PWM cycle. As a result, each pulse PLS indicates the duration of the gate charge period, i.e. the duration between the time instant $t_0$, at which the signal ON indicates a switch-on, and the time instant $t_1$, at which the transistor $T_L$ actually switches on (see also FIG. 2).

As mentioned above, during the gate charge period $T_{GCP}$, the current sense resistor $R_S$ basically "sees" the displacement current passing through the gate-source capacitance $C_{GS}$ (see FIG. 1). Therefore, according to the embodiments described herein, the time interval $T_{CGP}$ is blanked out for the purpose of current measurement, which is done with the help of the current sense resistor $R_S$.

Figure 4:
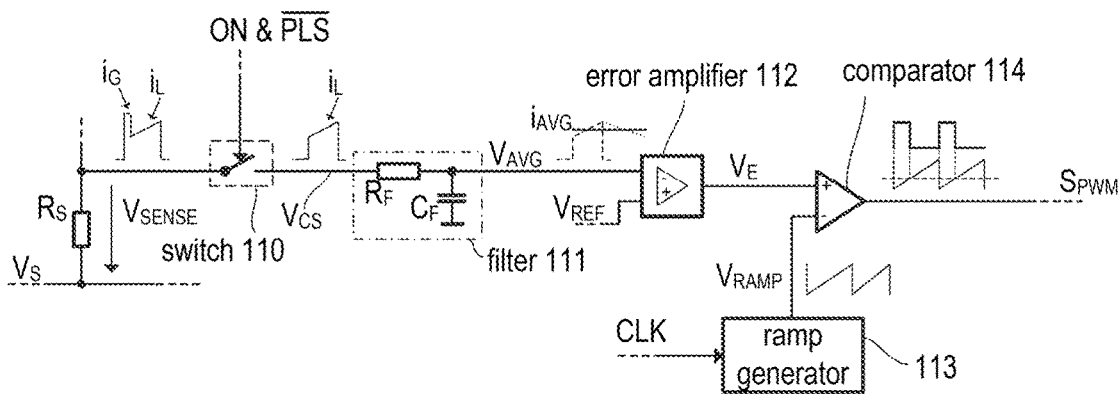
FIG. 4 illustrates an example of a circuit which is configured to determine a measured value representing an average load current for the control of a switching converter.

FIG. 4 illustrates an example of a circuit which can be used to control the buck converter of FIG. 1. The circuit of FIG. 4 may be regarded as part of the control circuit 12 of FIG. 1. According to FIG. 5, the circuit receives the current sense signal $V_{SENSE}$ as input signal (voltage drop across the resistor $R_S$) As indicated in FIG. 4, the current sense signal $V_{SENSE}$ is a superposition of a first portion, which corresponds to the gate current $i_G$ (during the time interval $T_{GCP}$), and a second portion, which corresponds to the load current $i_L$ passing through the load transistor $T_L$ (after the time interval $T_{GCP}$ as long as signal ON is High, see FIG. 2). The current sense signal $V_{SENSE}$ is provided to a pass filter 111 via a switch 110.

The switch 110 is closed as long as the logic conjunction ON & PLS is true. That is, the switch 110 is closed when the signal ON (or $S_PWM$) indicates a switch-on of the power transistor $T_L$ provided that the time interval $T_{GCP}$ has already lapsed. In essence, the switch 110 is switched on at the falling edges of the pulses PLS (i.e. when the inverse signal PLS transitions from High to Low at time instant $t_1$, see FIG. 2). As a consequence, the filter 111 sees, as input signal, a trapezoidal waveform, which is the current sense signal with the first portion (which corresponds to the to the gate current $i_G$) blanked out.

The filter 111 is configured to provide a signal $V_{AVG}$ at its output, which approximately corresponds to the average of the input signal (signal $V_{SENSE}$) during the time interval during which the switch 110 is closed (i.e. from $t_1$ to $t_2$, see FIG. 2). The filter may be implemented, for example, as a low pass filter, in particular as a simple first order RC lowpass filter (e.g. resistor $R_F$, capacitor $C_F$). As can be seen from FIG. 4, the low pass filter 111 does, in essence, average the (switched) current sense signal $V_{CS}$ over the time interval from $t_1$ to $t_2$ (see FIG. 2) which is $T_{ON}-T_{GCP}$. During the time interval $T_{OFF}$ (see FIG. 5), i.e. when the switch 110 is open, the averaged signal $V_{AVG}$ remains basically constant as the charge stored in the capacitor $C_F$ of the low-pass filter 111 remains constant (assuming the error amplifier 112 has a high input impedance). Due to the approximately trapezoidal waveform of the load current during the on-time and the off-time, and due to the constant clock frequency, the average current value is the same during the on-time and the off-time.

An error amplifier 112 receives the average current sense signal $V_{AVG}$ and a reference signal $V_{REF}$, which represents the current set-point/desired load current. The error amplifier 112 is basically a difference amplifier and generates an output signal (error signal $V_E$) which is based on (e.g. proportional to) the difference $V_{AVG}-V_{RFF}$. The error signal $V_E$ and a triangular signal $V_{RA}MP$ (e.g. a sawtooth/ramp signal) are provided to the inputs of a comparator 114, which is configured to compare the error signal $V_E$ and the ramp signal VRAMP and to generated the PWM signal $S_PWM$ at its output. As shown in FIG. 4, the PWM signal $S_{PWM}$ provided by the comparator 114 is at a High level when the ramp signal $V_{RAMP}$ is lower than the error signal VE, and at a Low level otherwise.

The ramp generator 113, which provides the ramp signal $V_{RA}MP$, usually operates at a fixed frequency $f_{PWM}$. That is, the start of a PWM period (time instant $t_0$ in FIG. 2) is triggered by (e.g. a rising edge of) a clock signal CLK (see FIG. 5, not shown in FIG. 4), wherein the end of the on-time $T_{ON}$ is determined by the comparator 114. It is noted that the concept of generating a PWM signal for controlling a switching converter by using an error amplifier and a ramp generator is as such known and thus not explained herein in more detail. However, different from known approaches, the example of FIG. 4 allows the controlling of the output current $i_{OUT}$ of a switching converter without actually measuring the output current $i_{OUT}$ passing through the load, but instead only the load current $i_L$ passing through the power transistor $T_L$ during the on-time $T_{ON}$, which is possible with an integrated current sense resistor $R_S$.

Figure 5:
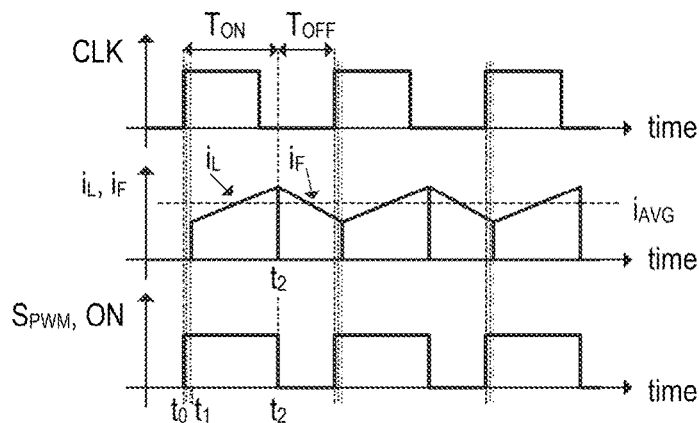
FIG. 5 includes timing diagrams illustrating the function of the circuit of FIG. 4.

FIG. 5 illustrates timing diagrams further illustrating the function of the circuit of FIG. 4. The top diagram of FIG. 5 illustrates an exemplary waveform of the mentioned clock signal CLK. The middle diagram of FIG. 5 illustrates the load current $i_L$ and the current iF passing through the free-wheeling diode $D_F$ during the off time $T_{OFF}$, and the bottom diagram illustrates the resulting signal ON (which corresponds to $S_{PWM}$). As can be seen in FIG. 5, the average $i_{AVG}$ of the current $i_L$ during the on-line $T_{ON}$ is equal to the current $i_F$ during the off-time $T_{OFF}$ and also equal to the total output current $i_{OUT}$ during a PWM cycle period $T_{PWM}=T_{ON}+T_{OFF}$. The time period $T_{GCP}$, which is blanked out for current measurement as explained above, is shaded gray in FIG. 5.

The concept described herein will be summarized below by way of example. It is understood that the following is not to be understood as an exhaustive listing of technical features but rather as an exemplary summary. According to one embodiment, a controller chip for a switching converter includes a first transistor (power transistor $T_L$), configured to provide a load current in accordance with a logic signal (see FIGS. 1 and 3, signal $S_PWM$ and signal ON), and a second transistor (sense transistor $T_S$) coupled to the first transistor and configured to provide a sense current that is indicative of the load current. The controller chip further includes a control circuit (see FIG. 1, control circuit 12) that is configured to determine an end of a switch-on phase (see FIG. 2, falling edge of pulse PLS at time $t_1$) of the sense transistor, and to provide a current sense signal (see FIG. 5, signal $V_{SENSE}$) that represents the sense current between a first time instant (see FIG. 2, time $t_1$), which corresponds to the determined end of the switch-on phase, and a second time instant (see FIG. 2, time $t_2$) at which the logic signal signals a switch-off of the first transistor.

The control circuit may include a low pass filter configured to filter the current sense signal (see FIG. 4, filter 111), and an error amplifier configured to generate an error signal (see FIG. 4, error amplifier 112 and signal $V_E$) representing a difference between the filtered current sense signal and a reference value. A ramp generator is configured to generate a periodic signal (see FIG. 5, ramp generator 113) which comprises a triangular pulse in each period. A comparator is configured to compare the periodic signal with the mentioned error signal (see FIG. 5, comparator 114), wherein the control circuit is configured to generate the logic signal (see FIG. 3, signal ON) based on an output signal (see FIG. 4, PWM signal $S_{PWM}$) of the comparator.

In order to form a buck converter, an inductor is connected to the first transistor, so that the load current passes through the inductor while the first transistor is switched on (see FIG. 1, inductor $L_O$, and FIG. 5, load current $i_L$), and a free-wheeling element (see FIG. 1, diode $D_F$) is coupled to the inductor, so that an inductor current can pass though the free-wheeling element while the first transistor is switched off (see FIG. 5, diode current $i_F$). An electric load, which may be a light emitting diode (or a series circuit of light emitting diodes), is coupled to the first transistor (see FIG. 1, power transistor $T_L$) via the inductor.

A further embodiment relates to a method that may be used in a switching converter. The method is also represented by the flow chart of FIG. 6. Accordingly, the method includes switching a first transistor (see FIG. 1, power transistor $T_L$) on and off in accordance with a logic signal (FIG. 6, box S1) so that a load current (see FIG. 1, current $i_L$) passes through the first transistor while it is switched on.

Figure 6:
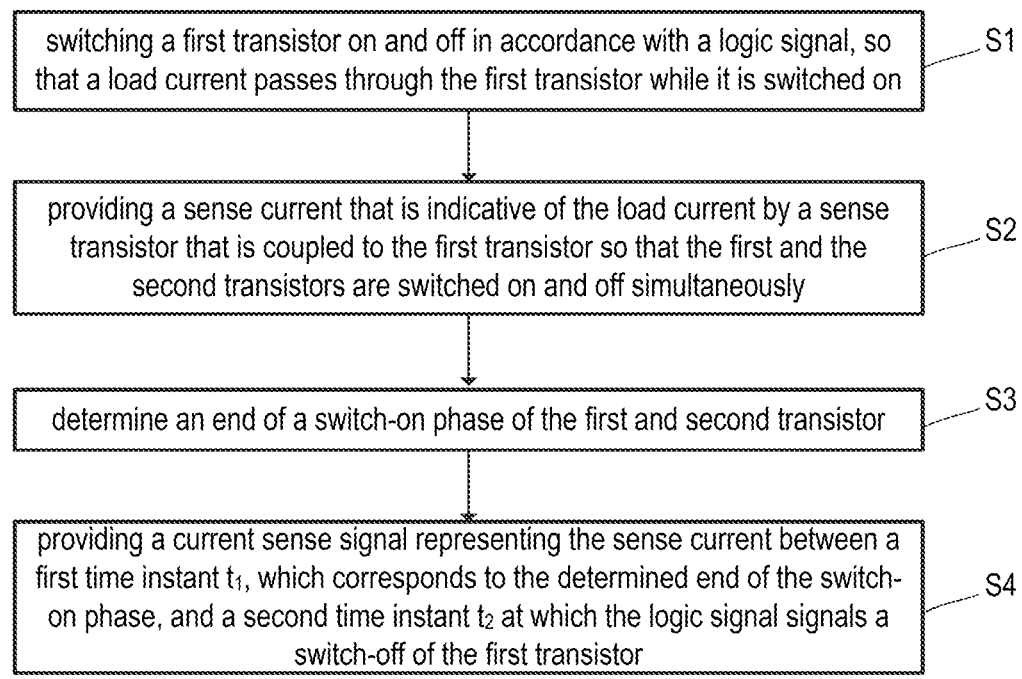
FIG. 6 is a flow chart illustrating an example of a method described herein which may be performed by a controller of a switching converter.

The method further includes: providing a sense current (see FIG. 1, current $i_S$), indicative of the load current by a second transistor (see FIG. 1, sense transistor $T_S$), that is coupled to the first transistor such that the first transistor and the second transistors are switched on and off simultaneously (FIG. 6, box S2), thus determining an end of a switch-on phase of the second transistor (FIG. 6, box S3), and providing a current sense signal (see FIG. 5, signal $V_{SENSE}$) that represents the sense current between a first time instant (see FIG. 2, time $t_1$), which corresponds to the determined end of the switch-on phase, and a second time instant (see FIG. 2, time $t_2$) at which the logic signal signals a switch-off of the first transistor (FIG. 6, box S4).

In one embodiment, the method may include filtering the current sense signal using a low-pass filter (see FIG. 4, filter 111). An error signal may be generated that represents a difference between the filtered current sense signal and a reference value (see FIG. 4, error amplifier 113, error signal $V_E$). The method may further include generating a periodic signal, which comprises a triangular pulse in each period (see FIG. 4, ramp signal $V_{RAMP}$), and comparing the periodic signal with the error signal using a comparator (see FIG. 4, comparator 114).

The mentioned logic signal may be generated based on an output signal of the comparator. Further, in one embodiment the logic signal is a modulated signal indicating on-times and off-times (see FIG. 5, $T_{ON}$ and $T_{OFF}$) of the first transistor, wherein the begin of each on-time triggers a respective switch-on phase (see FIG. 3, pulse PLS) of the second transistor.

In order to determine the end of the switch-on phase of the second transistor, the method may comprise modifying a time value (see FIGS. 2 and 3, time interval $T_{GCP}$), indicating the end of the switch-on phase, based on a voltage value of the gate voltage of the first transistor, sampled at the end of a preceding switch-on phase, and a reference value (see FIG. 3, sampled voltage value $V_{SMP}$, and reference voltage $V_{G,REF}$).

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A method comprising:
   switching a first transistor on and off in accordance with a logic signal, with a load current passing through the first transistor while it is switched on;
   providing a sense current that is indicative of the load current via a second transistor that is coupled to the first transistor such that the first and the second transistors are switched on and off simultaneously;
   determining an end of a switch-on phase of the second transistor; and
   providing a current sense signal that represents the sense current between a first time instant, which corresponds to the determined end of the switch-on phase, and a second time instant, at which the logic signal signals a switch-off of the first transistor.

2. The method of claim 1, further comprising:
   filtering the current sense signal using a low-pass filter.

3. The method of claim 2, further comprising:
   generating an error signal representing a difference between the filtered current sense signal and a reference value.

4. The method of claim 3, further comprising:
   generating a periodic signal which comprises a triangular pulse in each period;
   comparing the periodic signal with the error signal using a comparator; and
   generating the logic signal based on an output signal of the comparator.

5. The method of claim 1,
   wherein the logic signal is a modulated signal indicating on-times and off-times of the first transistor, and wherein a begin of each on-time triggers a respective switch-on phase of the second transistor.

6. The method of claim 1, wherein determining the end of the switch-on phase of the second transistor comprises:
   modifying a time value, indicating the end of the switch-on phase, based on a voltage value of a gate voltage of the first transistor, sampled at an end of a preceding switch-on phase, and a reference value.

7. A circuit comprising:
   a first transistor configured to provide a load current in accordance with a logic signal;
   a sense transistor coupled to the first transistor and configured to provide a sense current that is indicative of the load current;
   a control circuit that is configured to;
     determine an end of a switch-on phase of the sense transistor; and
     provide a current sense signal that represents the sense current between a first time instant, which corresponds to the determined end of the switch-on phase, and a second time instant at which the logic signal signals a switch-off of the first transistor.

8. The circuit of claim 7,
   wherein the control circuit comprises a switch configured to blank out the current sense signal from a third time instant, at which the logic signal signals a switch-on of the first transistor, and the first time instant.

9. The circuit of claim 7, wherein the control circuit comprises:
   a low pass filter configured to filter the current sense signal.

10. The circuit of claim 9, wherein the control circuit further comprises:
    an error amplifier configured to generate an error signal, representing a difference between the filtered current sense signal, and a reference value.

11. The circuit of claim 10, wherein the control circuit further comprises:
    a ramp generator configured to generate a periodic signal, which comprises a triangular pulse in each period; and
    a comparator, configured to compare the periodic signal with the error signal,
    wherein the control circuit is configured to generate the logic signal based on an output signal of the comparator.

12. The circuit of claim 7, further comprising:
    an inductor connected to the first transistor such that the load current passes through the inductor while the first transistor is switched on;

a free-wheeling element coupled to the inductor such that an inductor current can pass though the free-wheeling element while the first transistor is switched off; and an electric load which is coupled to the first transistor via the inductor.

\* \* \* \* \*